June 27, 1967 M. MILLER 3,328,651

SEMICONDUCTOR SWITCHING DEVICE AND METHOD OF MANUFACTURE

Filed Oct. 29, 1963 2 Sheets-Sheet 1

INVENTOR.
MARVIN MILLER

BY

David M. Keay

AGENT.

June 27, 1967 M. MILLER 3,328,651

SEMICONDUCTOR SWITCHING DEVICE AND METHOD OF MANUFACTURE

Filed Oct. 29, 1963 2 Sheets-Sheet 2

INVENTOR.
MARVIN MILLER

BY David M. Keay

AGENT.

United States Patent Office 3,328,651

Patented June 27, 1967

3,328,651
SEMICONDUCTOR SWITCHING DEVICE AND METHOD OF MANUFACTURE

Marvin Miller, Newton, Mass., assignor to Sylvania Electric Products Inc., a corporation of Delaware Filed Oct. 29, 1963, Ser. No. 319,857
2 Claims. (Cl. 317—235)

This invention relates to semiconductor electrical translating devices. More particularly, it is concerned with semiconductor switching devices of the type known as PNPN or four-layer devices.

Semiconductor devices having four successive layers, or zones, of semiconductor material of alternating conductivity types providing a three-junction device are well known. These devices, commonly referred to as PNPN switches, have a voltage-current characteristic which includes a negative resistance region intermediate high impedance and low impedance positive resistance regions. This characteristic permits their use in a variety of switching applications.

An improved semiconductor switching device of this type is described in detail in patent application Ser. No. 244,075, filed Dec. 12, 1962, in the names of Thomas A. Longo and Marvin Miller entitled, Semiconductor Switching Device and Method of Manufacture, and assigned to the assignee of the present invention. The four-layer semiconductor device described in that application is fabricated by a combination of epitaxial deposition and diffusion techniques. Several devices are commonly produced simultaneously on a single slice of semiconductor material.

A slice of semiconductor material of one conductivity type, for example P-type, is treated in epitaxial furnace apparatus to deposit on the upper surface of the slice a first layer of semiconductor material of P-type conductivity and then a second layer of N-type conductivity. The layers are epitaxial deposits, that is, together with the slice they form a wafer having single crystal structure. Following the epitaxial deposition procedure, a P-type conductivity imparting material is diffused into a plurality of regions at the surface of the N-type layer. An N-type conductivity imparting material is diffused into a portion of each of the P-type regions. The wafer of semiconductor material is then divided into a plurality of individual units each including one of the N-type diffused regions and an associated P-type diffused portion. Individual four-layer PNPN devices are thus obtained.

During the process of fabrication of the devices the surface of the second epitaxial layer into which the conductivity type imparting materials are diffused is covered with a suitable adherent non-conductive coating. Openings are made in the coating to delineate the surface areas at which diffusion into the wafer occurs. Subsequent to the diffusion steps this coating remains overlying the P-N junctions between the diffused N-type portion and the P-type region and between the diffused P-type region and the N-type region of the second epitaxial layer. Although these junctions are protected at their surface edges, the edges of the P-N junction between the two epitaxially grown layers are exposed. In many cases it is desirable to avoid the problems caused by the fact that the electrically active junction region is subject to the action of contaminants which reduce the perfection of the junction as formed and thereby cause deterioration of the electrical characteristics of the device with time.

It is an object of the present invention, therefore, to provide an improved semiconductor switching device.

It is another object of the invention to provide a PNPN semiconductor switching device having stable electrical characteristics.

It is also an object of the invention to provide a method for producing four-layer semiconductor switching devices having stable electrical characteristics.

Briefly, a semiconductor device in accordance with the foregoing objects of the invention comprises a body of semiconductor material having four zones of alternating conductivity types. The first zone of the body is of one conductivity type and has a surface area in a surface of the body. The second zone of the body is of the opposite conductivity type and lies intermediate the first zone and the remaining zones of the body and has a surface area in the surface of the body which encircles the surface area of the first zone. The third zone which is of the one conductivity type lies intermediate the first and second zones and the fourth zone of the body and has a surface area in the surface of the body which encircles the surface area of the second zone. The fourth zone which constitutes the remainder of the body is of the opposite conductivity type and contiguous the third zone. This zone has a surface area in the surface of the body which encircles the surface area of the third zone. A protective, adherent, non-conductive coating on portions of the surface overlies the three P-N junctions between the zones. Ohmic connections are provided to the appropriate zones to permit operation of the device as a circuit element.

PNPN devices which fulfill the foregoing description are fabricated according to the invention by employing the combination of processing steps herein described. A slice of semiconductor material of one conductivity type of very low resistivity is provided as a substrate upon which the active regions of the device are fabricated. A thin layer of semiconductor material of the same conductivity type as the substrate is deposited on a surface of the substrate by known epitaxial techniques. A second layer of semiconductor material of the opposite conductivity type is epitaxially deposited on the first layer. A material capable of imparting the one type of conductivity to the semiconductor material is then diffused into a portion of the second epitaxial layer to form a region of the one conductivity type extending from one surface of the second layer to the first epitaxial layer and encircling a region of the second layer of the opposite conductivity type. A material capable of imparting the one type of conductivity is also diffused into a portion of the region of the second epitaxial layer of the opposite conductivity type at the one surface to form a graded region of the one conductivity type with another portion of the region of the second layer of the opposite conductivity type lying intermediate the graded region and the zone of the one conductivity type constituted by the substrate, the first epitaxial layer, and the region of the one conductivity type of the second epitaxial layer. Then a material capable of imparting the opposite type of conductivity to the semiconductor material is diffused into a portion of the graded region of the one conductivity type at the one surface to form a graded region of the opposite conductivity type with another portion of said graded region of the one conductivity type lying intermediate the graded region of the opposite conductivity type and the other portion of the region of the second layer of the opposite conductivity type. Ohmic connections are then made to the appropriate regions of the device.

The graded regions referred to above are inherently formed by reason of the diffusion procedures employed. That is, by virtue of the fact that the diffusion is accomplished by the introduction of the conductivtiy type imparting materials at the exposed surface areas of the wafer, the concentration of the conductivity type imparting materials in the respective regions decreases with distance from the surface.

Additional objects, features, and advantages of the invention will be apparent from the following detailed discussion and the accompanying drawings wherein.

Figure 1:
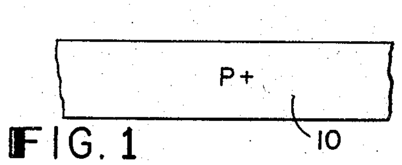
FIGS. 1 through 7 are elevational views in cross-section illustrating stages in the fabrication of a PNPN switching device in accordance with one embodiment of the invention.
Figure 2:
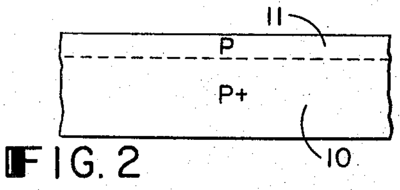

In the figures the various parts of the semiconductor elements are not drawn to scale. Certain dimensions are exaggerated in relation to other dimensions in order to present a clearer understanding of the invention.

In fabricating a PNPN device in accordance with the invention as illustrated by FIGS. 1 through 7 a slice or substrate 10 of single crystal low resistivity semiconductor material of one conductivity type is provided as a support upon which the active device structure is fabricated. The substrate is usually a slice of relatively large surface area on which many devices are fabricated simultaneously. However, for purposes of clarity the production of only a single device on a portion of a slice will be shown and described. In the following description silicon is employed as the semiconductor material, although the teachings are obviously applicable to other semiconductor materials. Also by way of example, the substrate slice is of P-type conductivity.

The slice 10 is placed in a suitable furnace apparatus, and an epitaxial layer 11 of high resistivity P-type silicon is grown on the surface as by known vapor deposition techniques. A gaseous compound of silicon mixed with a controlled quantity of a gaseous compound of a P-type conductivity imparting material is reacted with hydrogen at the surface of the slice to cause deposition of silicon lightly doped with the conductivity type imparting material. A layer 11 which is precisely controllable as to thickness and as to resistivity and which is a continuation of the crystalline structure of the semiconductor slice 10 is thus deposited on the surface.

Immediately following this treatment and without the necessity for removing the slice from the furnace, an N-type layer 12 is similarly grown on the P-type layer 11. According to known vapor deposition techniques a gaseous compound of an N-type conductivity imparting material is mixed in a controlled manner with the gaseous silicon compound in place of the compound of P-type conductivity imparting material. The N-type epitaxial layer is also precisely controlled as to thickness and resistivity.

Figure 3:
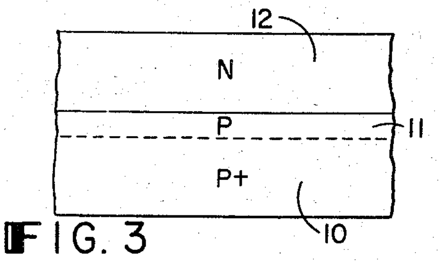

The single crystal wafer produced by the epitaxial growth of the two layers on the heavily doped substrate slice, as illustrated in FIG. 3 is then treated to diffuse a P-type conductivty imparting material into a portion of the N-type layer 12. In order to diffuse the P-type conductivity imparting material only into the portion desired, known techniques of diffusing through an opening 13 in an adherent protective coating 14 are employed.

According to one well-known technique an adherent, non-conductive, protective coating of silicon oxide is formed on the surface ofthe silicon wafer as by heating it in a wet oxygen atmosphere. The oxide coating is covered with a photo-resist solution and the photo-resist exposed to ultraviolet light through a mask shielding the area delineating the opening through which the conductivity type imparting material is to be diffused. The photo-resist on this area is thus not exposed to the light, and after the exposed portions are developed, the unexposed resist on the area is easily washed off while the exposed portions remain. The oxide coating unprotected by the resist is removed in an etching solution which does not attack the resist, thereby forming the opening 13 in the oxide coating 14. The previously exposed photo-resist is then dissolved to leave only the oxide coating with the opening of the desired configuration on the surface of the silicon.

Figure 4:
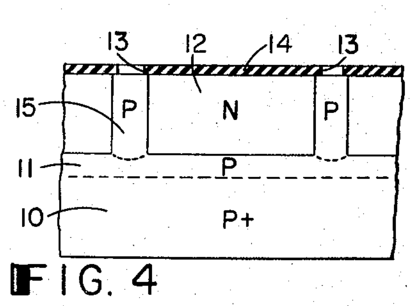
Figure 4A:
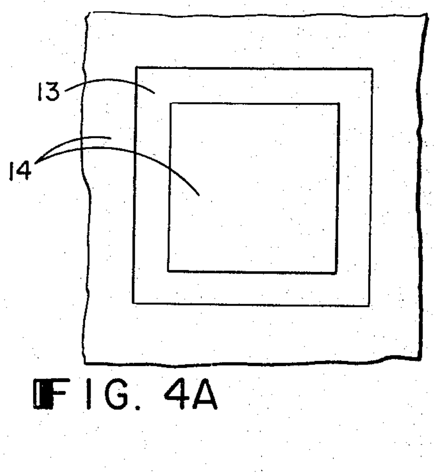
FIG. 4A is a plan view of the portion of the wafer shown in FIG. 4.

In accordance with the present invention the opening 13 in the oxide coating 14 encircles a portion of the coating as can best be seen in FIG. 4A. The wafer is treated in a diffusion furnace to diffuse a P-type conductivity imparting material through the opening 13 in the oxide coating and into a portion 15 of the N-type epitaxial layer 12. The diffusion treatment is maintained for a period of time sufficient to cause P-type conductivity imparting material to diffuse completely through the N-type epitaxial layer and convert to P-type conductivity a region 15 extending from the surface of the N-type layer to the P-type epitaxial layer 11. An isolated N-type region 12 completely surrounded except at its surface area by P-type material of the first epitaxial layer 11 and of the diffused region 15 is thereby obtained. Since the conductivity type imparting material diffuses into the semiconductor material in all possible directions from the surface area exposed at the opening, the edges of the diffused region at the surface are located at a distance from the edges of the opening and thus are covered by the oxide coating.

Figure 5:
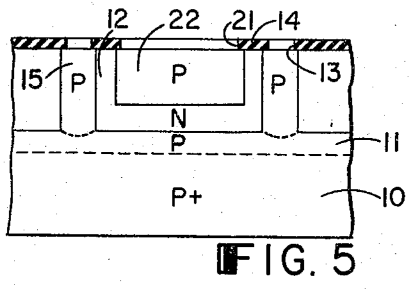
Figure 6:
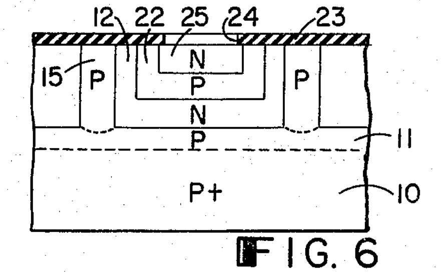

Photo-resist masking and etching procedures are then employed to produce an opening 21 in the silicon oxide coating 14 located centrally of the isolated N-type region 12. As illustrated in FIG. 5 a P-type conductivtiy imparting material is diffused through the opening to convert a portion 22 of the isolated N-type region to P-type conductivity. A graded P-type region is thus obtained in which the resistivity increases with distance from the surface of the wafer. The diffusion of additional P-type conductivity imparting material into the diffused region 15 through the opening 13 has no effect on the electrical characteristics of the final device. Therefore, it is not necessary to reconstitute the oxide coating over the entire surface before forming the central opening 21.

The silicon oxide coating is then reconstituted and the photo-resist masking and etching procedures repeated to produce a silicon oxide coating 23 having a small opening 24 therein. An N-type conductivity imparting material is diffused through the opening to reconvert a portion 25 of the p-type diffused region to N-type conductivity. This N-type region is also graded with the heavier concentration of conductivity type imparting material adjacent the surface and the lesser concentration at the junction with the unreconverted p-type region 22.

The oxide coating 23 is further treated according to the abovementioned masking and etching techniques to produce another opening 26 of annular configuration therethrough which exposes an area of the surface of the diffused p-type region 22. The surface areas of the diffused N- and P-type regions exposed at the openings 24 and 26 in the oxide coating 23 are metallized to produce ohmic contacts 30 and 31 as by coating with a thin film of aluminum according to known vacuum deposition, masking, and etching techniques.

Figure 7:
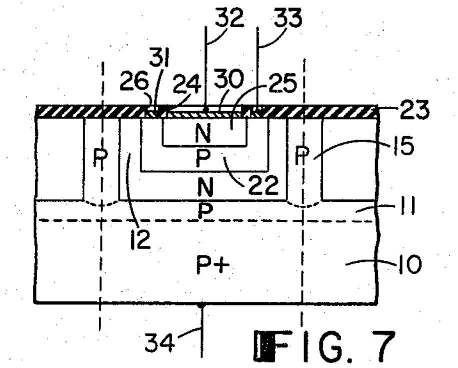
Figure 8:
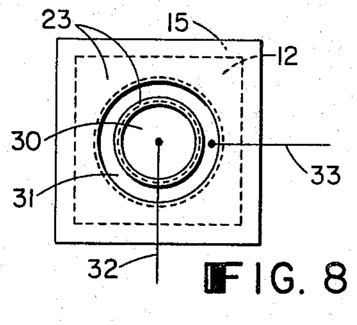
FIG. 8 is a plan view of a PNPN switching device fabricated according to the method illustrated in FIGS. 1 through 7.
Figure 9:
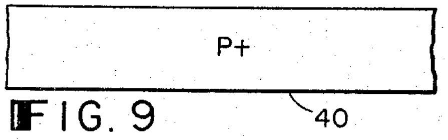
FIGS. 9 through 15 are elevational views in cross-section illustrating stages in the fabrication of a PNPN switching device in accordance with a second embodiment of the invention.
Figure 10:
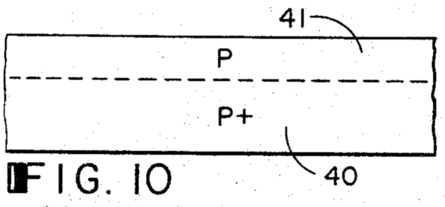
Figure 11:
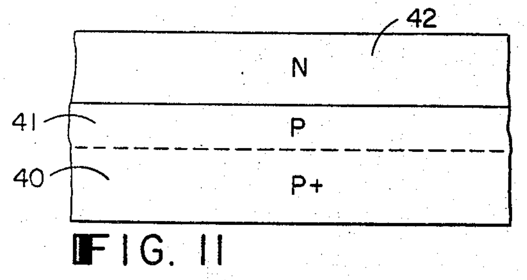
Figure 12:
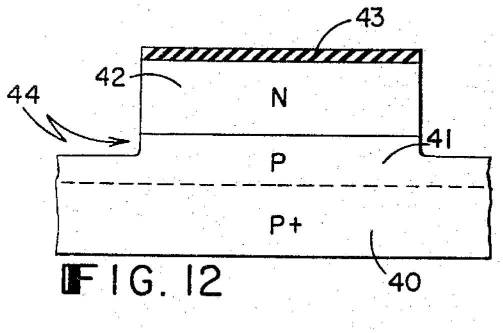

The wafer of semiconductor material is then subdivided into individual device units by severing at the diffused P-type region 15 as indicated by the dashed lines in FIG. 7. Severing may be accomplished by the known techniques of scribing intersecting sets of grooves in the surface of the wafer, and then breaking the wafer along the scribed grooves. FIG. 8 is a plan view of a device obtained.

As can be seen from FIGS. 7 and 8 each device includes a body of semiconductor material having four zones of alternating conductivity types forming three P-N junctions. The two junctions produced by diffusion of P-type and then N-type conductivity imparting materials into the isolated N-type region 12 extend to the surface of the body and the edges are protected by overlying portions of the adherent nonconductive protective oxide coating. The junction between the N-type region 12 of the epitaxial layer and the P-type zone which includes the P-type epitaxial layer 11 is altered by the first P-type diffused region 15 so that the edge of the resulting P-N junction is also formed at the surface under the oxide coating. Subsequent dividing of the wafer is carried out along this diffused region so that the junction remains protected.

As illustrated in the plan view of FIG. 8 the first diffused P-type region 15 encircles an N-type region 12 of generally square configuration. However, the specific configuration chosen is immaterial so long as the diffused region encircles a portion of the N-type epitaxial layer and extends to the P-type epitaxial layer so as to completely surround an isolated region of the N-type epitaxial layer with P-type material except at the surface.

Connections 32 and 33 are made to the metallized area contacts 30 and 31, respectively. An ohmic connection 34 is also made to the low resistivity P-type substrate 10. In effect this connection together with the heavily doped P-type substrate provides a low resistance electrode making electrical contact to the P-type epitaxial region 11.

Various stages in the fabrication of a PNPN switching device in accordance with a second embodiment of the invention are illustrated in FIGS. 9 through 15. A slice 40 of single crystal P-type silicon of low resistivity is again provided as a supporting substrate on which the active device structure is fabricated. An epitaxial layer 41 of high resistivity P-type material is grown on a surface of the substrate as by known vapor deposition techniques. An N-type epitaxial layer 42 is then grown on the P-type layer.

An adherent oxide coating is then formed on the surface of the N-type epitaxial layer 42 and portions of the coating are removed to leave a plurality of surface areas of circular configuration protected by oxide coating 43. For purposes of illustration only the portion of the slice associated with one of these protected areas is shown in the drawings. The wafer is treated in a suitable etching solution which dissolves silicon but does not attack protective material overlying the circular surface area. The wafer remains in the etching solution for sufficient time so that the silicon of the N-type layer is completely dissolved except for those regions underlying the oxide coating. The depth of the etching into the P-type epitaxial layer is not significant, but all N-type material not in the resulting mesa 44 is removed.

Figure 13:
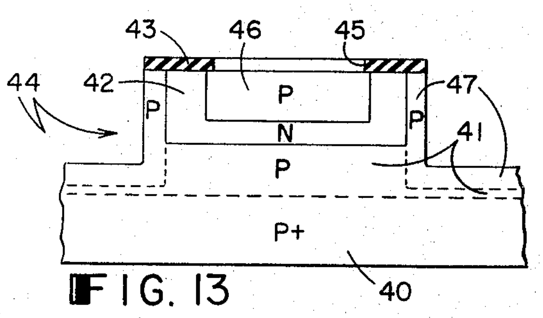

An opening 45 is then formed in the protective coating 43 overlying the mesa as by the aforementioned photoresist, masking, and etching techniques. The wafer is then treated in a diffusion furnace to diffuse a P-type conductivity imparting material into the portions of the upper surface of the wafer which are not protected by the oxide coating. As shown in FIG. 13 the P-type conductivity imparting material diffuses through the opening 45 in the coating and converts a portion 46 of the N-type epitaxial layer to a graded P-type region. In addition P-type conductivity imparting material diffuses into the exposed portion of the N-type region at the vertical edges of the mesa. This diffused P-type region 47 forms a junction with the remaining N-type region having its edges under the adherent oxide coating on the surface of the mesa. By virtue of the diffusion treatment, the remaining N-type portion of the second epitaxial layer 42 is completely surrounded by P-type material except at its surface area, which is protected by the adherent oxide coating 43.

Figure 14:
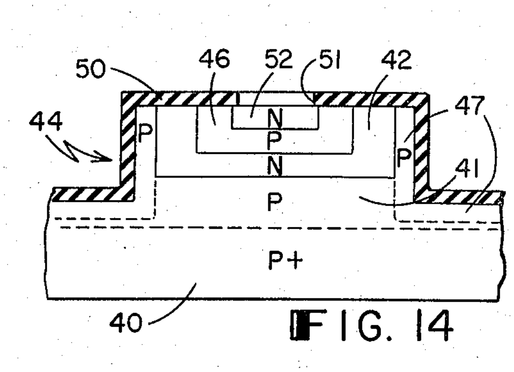

The silicon oxide coating is then reconstituted over the entire upper surface of the silicon wafer and the photoresist masking and etching procedures repeated to produce a silicon oxide coating 50 having a small opening 51 therein as illustrated in FIG. 14. An N-type conductivity imparting material is diffused through the opening 51 to reconvert a portion 52 of the P-type region to N-type conductivity. This portion is also a graded region with a heavier concentration of conductivity type imparting material adjacent the surface and a lesser concentration at the junction with the unreconverted P-type region 46.

The oxide coating is further treated according to the above mentioned masking and etching techniques to produce an annular opening 53 therethrough which exposes an area of the surface of the diffused P-type region 46. The surface areas of the diffused N- and P-type regions exposed at the openings 51 and 53 in the oxide coating 50 are then metallized to produce ohmic contacts 60 and 61 as by coating with a thin film of aluminum according to known vacuum deposition, masking, and etching techniques.

Figure 15:
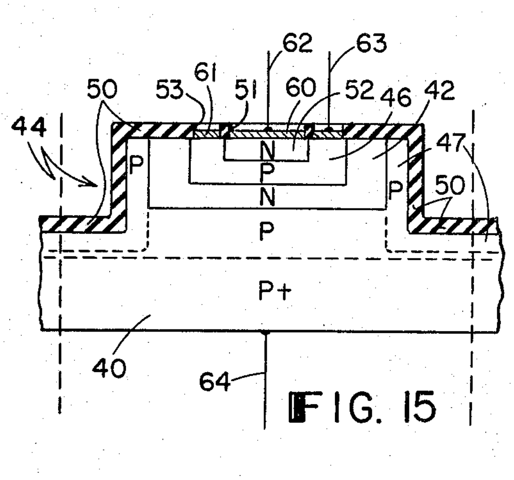
Figure 16:
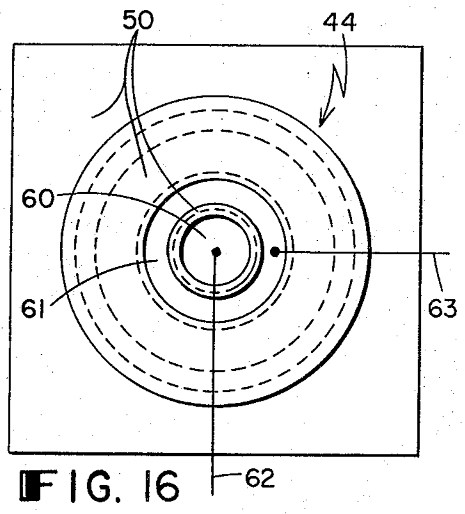
FIG. 16 is a plan view of a PNPN switching device fabricated according to the method illustrated in FIGS. 9 through 15.

The wafer is then severed in the portions indicated by the dashed lines in FIG. 15 as by the previously mentioned scribing and breaking techniques. The wafer is thus divided into a plurality of individual device elements each including a mesa 44. FIG. 16 is a plan view of an individual device.

As can be seen from FIGS. 15 and 16 the junctions between regions of opposite conductivity types are completely protected. The edges of the junctions at the surface of the body of semiconductor material all lie at the upper surface of the mesa 44 and are covered by the adherent oxide coating 50.

Connections 62 and 63 are then made to the metallized area contacts 60 and 61, respectively. An ohmic connection 64 is also made to the low resistivity P-type substrate 40. Electrical connections can thus be made to the N-type graded region 52, the P-type graded region 46, and the epitaxial P-type material 41.

In the fabrication of a typical PNPN switching device in accordance with the first embodiment of the invention illustrated in FIGS. 1 through 8 the starting material or substrate was a slice 10 of single crystal P-type silicon heavily doped with boron to produce a resistivity of approximately .01 ohm-centimeter. The slice was approximately 6 mils thick. An epitaxial layer 11 of P-type silicon doped with boron was grown on a surface of the slice. The layer was approximately 10 microns thick and of about 1 ohm-centimeter resistivity. Next, an N-type conductivity epitaxial layer 12 approximately 15 microns thick was grown on the P-type layer. The silicon was doped with arsenic to provide a resistivity of about 1 ohm-centimeter.

Following the epitaxial deposition processes, the two P-type regions 15 and 22 and the N-type region 25 were successively diffused into the N-type epitaxial layer. Boron was diffused through an opening 13 in the oxide coating 14 encircling a portion of the coating on the surface of the N-type layer approximately 13 mils square to produce a P-type diffused region 15 extending to the P-type epitaxial layer 11. Boron was then diffused through an 8 mil diameter circular opening 21 in the oxide coating 14 on the surface of the isolated N-type region 12 to produce a diffused P-type region 22. Phosphorus was then diffused through a 4 mil diameter circular opening 24 in the reconstituted oxide coating 23 to produce an N-type region 25 centrally of the P-type diffused region 22. The double diffusion into the N-type layer provided a diffused P-type region 22 about 4 microns thick and a double diffused N-type region 25 about 3 microns thick.

Following the formation of the contacts 30 and 31 by vacuum deposition of aluminum, the wafer was severed to produce individual device units each approximately 18 mils square.

What is claimed is:

1. A semiconductor device comprising a body of semiconductor material including four zones of alternating conductivity type arranged in succession on a low resistivity substrate of semiconductor material of one conductivity type, the first of said zones contiguous said substrate being semiconductor material of the one conductivity type, the second of said zones forming a P-N junction with said first zone and being semiconductor material of the opposite conductivity type of substantially uniform resistivity, the third of said zones forming a graded P-N junction with said second zone and being semiconductor material of the one conductivity type, the fourth of said zones forming a graded P-N junction with said third zone and being semiconductor material of the opposite conductivity type, said zones each having a surface area in a surface of the body, the surface area of the third zone encircling the surface area of the fourth zone, the surface area of the second zone encircling the surface area of the third zone, and the surface area of the first zone encircling the surface area of the second zone, the first of said zones including a region of substantially uniform high resistivity semiconductor material contiguous the substrate and intermediate the substrate and the second of said zones and a graded region extending from the surface area to the first-mentioned region, a coating of an adherent non-conductive material on said surface of the body overlying the edges of the P-N junctions between the first zone and the second zone, the second zone and the third zone, and the third zone and the fourth zone, and ohmic connections to the substrate, the fourth zone, and the third zone, the second zone being free of any connection.

2. A semiconductor device comprising a body of semiconductor material including four zones of alternating conductivity type, said body having a mesa extending above the major portion of the body, said mesa having a flat surface lying generally parallel to the surface of the major portion of the body and edge surfaces between said flat surface and the surface of the major portion of the body, the first zone of said body being of one conductivity type lying within said mesa and having a surface area in said flat surface of the mesa, the second zone of said body being of the opposite conductivity type lying within said mesa intermediate said first zone and the remaining zones and having a surface area in said flat surface of the mesa encircling the surface area of the first zone, the third zone of said body being of the one conductivity type lying within said mesa intermediate said first and second zones and the fourth zone and having a surface area in said flat surface of the mesa encircling the surface area of the second zone, the fourth zone constituting the remainder of the mesa and the major portion of the body being of the opposite conductivity type contiguous the third zone and having a surface area in said flat surface of the mesa encircling the surface area of the third zone, an adherent coating of non-conductive material on said flat surface of the mesa overlying the junctions between the first and second zones, the second and third zones, and the third and fourth zones, and ohmic connections to said first zone and said fourth zone.

References Cited

UNITED STATES PATENTS

| | | | |
|---|---|---|---|
| 2,993,154 | 7/1961 | Goldey et al. | 317—235 |
| 3,146,135 | 8/1964 | Chih-Tang Sah | 317—235 |
| 3,197,681 | 7/1965 | Broussard | 317—235 |
| 3,204,160 | 8/1965 | Chih-Tang Sah | 317—235 |
| 3,220,896 | 11/1965 | Miller | 317—235 |
| 3,260,902 | 7/1966 | Porter | 317—235 |

JOHN W. HUCKERT, *Primary Examiner.*

JAMES D. KALLAM, *Examiner.*

R. F. POLISSACK, *Assistant Examiner.*